(12) United States Patent
Gershon et al.

(10) Patent No.: US 10,396,221 B2
(45) Date of Patent: *Aug. 27, 2019

(54) SOLUTION PROCESS FOR SILVER-CONTAINING CHALCOGENIDE LAYER DEPOSITION

(71) Applicant: INTERNATIONAL BUSINESS MACHINES CORPORATION, Armonk, NY (US)

(72) Inventors: Talia S. Gershon, White Plains, NY (US); Richard A. Haight, Mahopac, NY (US); Saurabh Singh, Queens, NY (US); Teodor K. Todorov, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/951,288

(22) Filed: Apr. 12, 2018

(65) Prior Publication Data

US 2018/0374971 A1    Dec. 27, 2018

Related U.S. Application Data

(63) Continuation of application No. 15/634,477, filed on Jun. 27, 2017, now Pat. No. 9,997,655.

(51) Int. Cl.
*H01L 31/032* (2006.01)
*H01L 31/18* (2006.01)

(52) U.S. Cl.
CPC .......... *H01L 31/0326* (2013.01); *H01L 31/18* (2013.01); *Y02E 10/50* (2013.01); *Y02P 70/521* (2015.11)

(58) Field of Classification Search
CPC .......... H01L 31/0326; H01L 21/02557; H01L 21/0256; H01L 31/18
See application file for complete search history.

(56) References Cited

U.S. PATENT DOCUMENTS 9,608,141 B1 *  3/2017  Gershon ......... H01L 31/022483
2011/0132462 A1  6/2011  Free et al.
(Continued)

FOREIGN PATENT DOCUMENTS

CN    103560165 A    2/2014
CN    103709821 A    4/2014
(Continued)

OTHER PUBLICATIONS

List of IBM Patents or Patent Applications Treated as Related dated Apr. 12, 2018, 2 pages.

(Continued)

*Primary Examiner* — Jaehwan Oh
(74) *Attorney, Agent, or Firm* — Tutunjian & Bitetto, P.C.; Vazken Alexanian

(57) ABSTRACT

A method of preparing a $Ag_2ZnSn(S,Se)_4$ compound, including dissolving selenourea ($SeC(NH_2)_2$) in an aprotic solvent, and dissolving a silver salt, a zinc salt, and a tin salt in the aprotic solvent with the selenourea to form a metal solution; and coating the metal solution onto a substrate to form an $Ag_2ZnSn(S,Se)_4$ compound layer on the substrate.

20 Claims, 3 Drawing Sheets

(56) References Cited

U.S. PATENT DOCUMENTS

| | | | | |
|---|---|---|---|---|
| 2017/0133539 A1* | 5/2017 | Gershon | ............... | H01L 31/072 |
| 2017/0194518 A1* | 7/2017 | Gershon | ............. | H01L 31/0326 |
| 2018/0006173 A1* | 1/2018 | Gershon | ............. | H01L 31/0326 |

FOREIGN PATENT DOCUMENTS

| | | |
|---|---|---|
| CN | 104269460 A | 1/2015 |
| CN | 104701138 A | 6/2015 |
| CN | 105576076 A | 5/2016 |

OTHER PUBLICATIONS

Chagarov et al., "Ag2ZnSn(S,Se)4: A highly promising absorber for thin film photovoltaics", The Journal of Chemical Physics, vol. 144. Issue 10. Mar. 14, 2016. pp. 1-11.

Chen et al., "Rational synthesis of (Cu1-xAgx)2ZnSnS4 nanocrystals with low defect and tuning band gap", Materials Letter. vol. 181. Jun. 11, 2016. pp. 317-320.

Collord et al., "Combinatorial Exploration of the Effects of Intrinsic and Extrinsic Defects in Cu2ZnSn(S,Se)4", IEEE Journal of Photovoltaics. vol. 5. No. 1. Nov. 3, 2014. pp. 258-298.

Gershon et al., "Photovoltaic Materials and Devices Based on the Alloyed Kesterite Absorber (AgxCu1-x) 2ZnSnSe4", Advanced Energy Materials. vol. 6. Issue 10. May 25, 2016. pp. 1-7.

Gong et al, "Crystallographic and optical properties of (Cu, Ag)2ZnSnS4 and (Cu, Ag)2ZnSnSe4 solid solutions", Physica Status Solidi C. vol. 12, No. 6, Apr. 14, 2015. pp. 700-703.

Hages et al., "Optoelectronic and Material Properties of Nanocrystal-based CZTSe Absorbers with Ag-alloying", Solar Energy Materials and Solar Cells. vol. 145. Part 3. Feb. 29, 2016. pp. 1-12.

Khadka et al., "A Nonvacuum Approach for Fabrication of Cu2ZnSnSe4/In2S3 Thin Film Solar Cell and Optoelectronic Characterization", The Journal of Physical Chemistry C. vol. 119. No. 22. May 19, 2015, pp. 1-10.

Larramona et al., "8.6% Efficient CZTSSe Solar Cells Sprayed from Water—Ethanol CZTS Colloidal Solutions", The Journal of Physical Chemistry Letters. Oct. 12, 2014. vol. 5. No. 21. pp. 3763-3767.

Li et al., "The role of Ag in (Ag,Cu)2ZnSnS4 thin film for solar cell application", Journal of Alloys and Compounds, vol. 625. Nov. 28, 2014. pp. 277-283.

Li et al., "Mild solvothermal synthesis of Cu2ZnSn(SxSe1-x)4 nanocrystals with tunable phase structure and composition", Journal of Power Sources. vol. 294. Jul. 3, 2015. pp. 603-608.

Liu et al., "Kesterite Cu2ZnSn(S,Se)4 Solar Cells with beyond 8% Efficiency by a Sol-Gel and Selenization Process", Applied Materials & Interfaces. vol. 7. No. 26. Jun. 16, 2015. pp. 14376-14383.

Tian et al., "A robust and low-cost strategy to prepare Cu2ZnSnS4 precursor solution and its application in Cu2ZnSn(S,Se)4 solar cells", Royal Society of Chemistry Advances 2015. vol. 5, pp. 4184-4190.

Xin et al., "8% Efficient Cu2ZnSn(S,Se)4 Solar Cells from Redox Equilibrated Simple Precursors in DMSO", Advanced Energy Materials. vol. 4. No. 11. Aug. 1, 2014. pp. 1-5.

Zhang et al., "A Versatile Solution Route to Efficient Cu2ZnSn(S,Se)4 Thin-Film Solar Cells", Chemistry of Materials. vol. 27. No. 6. Mar. 2, 2015. pp. 2114-2120.

* cited by examiner

SOLUTION PROCESS FOR SILVER-CONTAINING CHALCOGENIDE LAYER DEPOSITION

BACKGROUND

Technical Field

The present invention generally relates to photovoltaic absorber material layers of the $Ag_2ZnSn(S,Se)_4$ (AZTSSe) type that are less disordered compared to $Cu_2ZnSn(S,Se)_4$ (CZTSSe) material layers, and more particularly to preparation methods involving solution processed $Ag_2ZnSn(S,Se)_4$ using a selenourea complexing agent.

Description of the Related Art

Commercial chalcogenide photovoltaic materials include II-VI binary compounds, for example, cadmium-telluride (CdTe), and quaternary compounds, for example, copper-indium/gallium-selenide (CIGS). While achieving good performance the scaling of these technologies to terawatt levels may be impeded due to issues related to cadmium toxicity and/or the scarcity of indium and tellurium in the Earth crust that make the future of these technologies a subject to materials availability and significant market price fluctuations.

Chalcogenide-based $I_2$-II-IV-$VI_2$ quaternary compounds, for example, copper-zinc-tin-selenide (CZTS) materials have been investigated for use in solar cells. Both the device structures and materials can be analogous to I-III-$VI_2$ quaternary compounds, for example, copper-indium/gallium-selenide (CIGS), wherein the rare element indium is substituted with the earth-abundant zinc and tin. Furthermore, the $I_2$-II-IV-$VI_2$ materials do not contain toxic cadmium or lead, such as CdTe or organo-lead perovskites, making them potential candidates for large-scale photovoltaic manufacturing.

Forming $I_2$-II-IV-$VI_4$ quaternary compounds can be very challenging due to multiple phases and crystal structures that the elements can form. These to a large extent can contribute to inferior materials properties in comparison to CIGS, such as low carrier mobility and band tailing resulting in lower device performance in general and voltage in particular. New materials that have better performance, are less expensive, and are more readily available without the disadvantages of the presently used elements are, therefore, sought.

SUMMARY

In accordance with an embodiment of the present invention, a method of preparing a $Ag_2ZnSn(S,Se)_4$ compound is provided. The method includes dissolving selenourea (SeC$(NH_2)_2$) in an aprotic solvent, and dissolving a silver salt, a zinc salt, and a tin salt in the aprotic solvent with the selenourea to form a metal solution. The method further includes coating the metal solution onto a substrate to form an $Ag_2ZnSn(S,Se)_4$ compound layer on the substrate.

In accordance with another embodiment of the present invention, a method of preparing a $Ag_2ZnSn(S,Se)_4$ compound is provided. The method includes dissolving about 100 mg to about 350 mg of selenourea (SeC$(NH_2)_2$) per about 1.5 ml of dimethyl sulfoxide (DMSO). The method further includes dissolving about 50 mg to about 175 mg of silver chloride (AgCl), about 37 mg to about 133 mg of zinc chloride ($ZnCl_2$), and about 30 mg to about 105 mg of tin (IV) chloride ($SnCl_4$) in the DMSO solution containing the selenourea to form a metal solution. The method further includes coating the metal solution onto a substrate to form an $Ag_2ZnSn(S,Se)_4$ compound layer on the substrate.

In accordance with yet another embodiment of the present invention, a method of preparing a $Ag_2ZnSn(S,Se)_4$ compound coated on a conductive substrate is provided. The method includes dissolving selenourea (SeC$(NH_2)_2$), silver chloride (AgCl), zinc chloride ($ZnCl_2$), and tin (IV) chloride ($SnCl_4$) in dimethyl sulfoxide (DMSO) to form a metal solution. The method further includes coating the metal solution on the conductive substrate by spin coating, inkjet printing, or spray coating.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
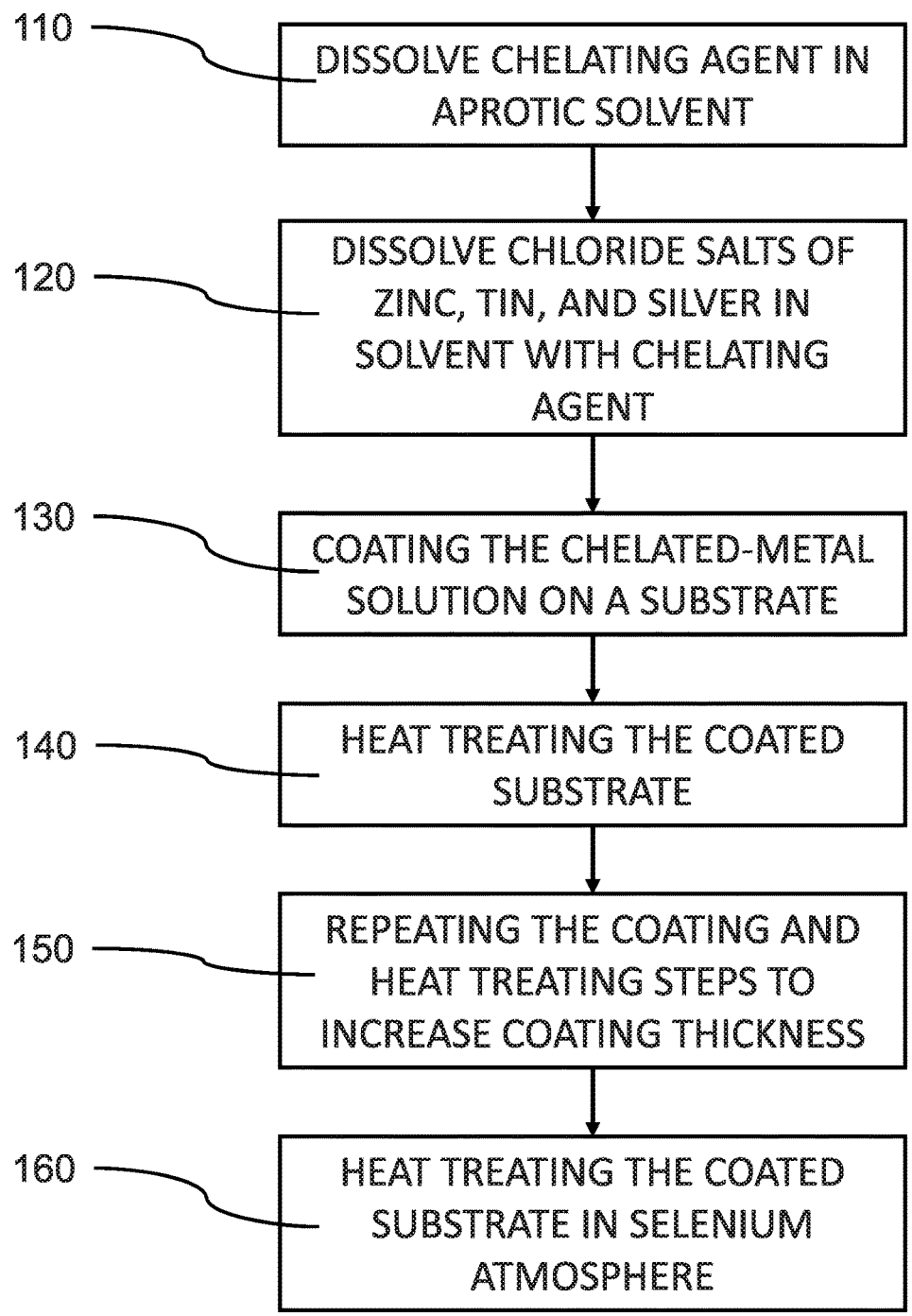
FIG. 1 is a block/flow diagram showing a formation and coating process for a $Ag_2ZnSn(S,Se)_4$ compound, in accordance with an embodiment of the present invention.

Embodiments of the present invention relate generally to a method to produce $Ag_2ZnSn(S,Se)_4$ (AZTS) compounds, where the compound, $AG_{(2-x)}Zn_{(1+y)}SN(S_{(1-z)}, Se_{(z)})_{(4+q)}$, can have composition ranges of wherein $0 \leq x \leq 1$; $0 \leq y \leq 1$; $0 \leq z \leq 1$; $-1 \leq q \leq 1$. In various embodiments, the kesterite has the above formula wherein x, y, z and q respectively are: $0 \leq x \leq 0.5$; $0 \leq y \leq 0.5$; $0 \leq z \leq 1$; $-0.5 \leq q \leq 0.5$. In addition CZTS system suffers from band tailing and low voltage that needs to be improved. There is a need in the art to develop low-cost high-throughput methods for depositing these materials. Silver substitution in CZTS can show decreased band tailing in photoluminescence spectra.

Selenourea can be used as a chelating agent for metal sources in a solvent including, but not limited to, dimethyl sulfoxide (DMSO), dimethylformamide (DMF), tetrahydro furan (THF), alcohols, and mixtures thereof. The chelating agent is a polydentate ligand that can bind to a metal ion. Metal sources can be metal chlorides, iodides, bromides, nitrates, or acetates. In various embodiments, chloride salts of silver (Ag), zinc (Zn), and tin (Sn) are dissolved in DMSO through complexation with selenourea.

Embodiments of the present invention relate generally to the use of selenourea as a complexing agent and selenium source for direct solution coating of $I_2$-II-IV-$VI_4$ and more particularly $Ag_2ZnSn(S,Se)_4$ for solar cell formation.

Embodiments of the present invention relate generally to reducing the density of bulk defects to correct band tailing and increase open circuit voltage, $V_{oc}$, of CZTSSE photocells by a solution preparation method. Tailing in the density of states can translate into tailing in the absorption spectra.

Embodiments of the present invention relate generally to a reduction in antisite defects by suppressing disorder in the Cu—Zn sublattices by using silver (Ag) atoms to replace at least a portion of the copper (Cu) atoms in the sublattice.

$Cu_{Zn}$ and $Zn_{Cu}$ antisites can occur on scales of $10^{19}$-$10^{20}$ cm$^{-3}$; where the defects are charged, which can cause extreme band tailing as measured by slow decay in the internal quantum efficiency (IQE) below the band gap energy (Eg), a red shift of the photoluminescence (PL) peak relative to Eg, and broadening of the PL peak. The IQE is the ratio of the number of charge carriers collected by the solar cell to the number of photons of a given energy that shine on the solar cell from outside and are absorbed by the cell.

Cu and Zn cations can intermix in the kesterite structure. $Ag_{Zn}$ and $Zn_{Ag}$ antisite defects can have a formation energy higher by a factor of 2 than the $Cu_{Zn}$ and $Zn_{Cu}$ antisite defects, which reduces the Ag—Zn defect occurrence to 10× less (i.e., 1 order of magnitude) than the Cu—Zn defect occurrences.

Embodiments of the present invention relate generally to forming $Ag_2ZnSn(S,Se)_4$, which has been found to have a much lower defect density than CZTSSe for photovoltaic devices using non-toxic or less toxic materials compared to other preparation methods of CZTSSe and AZTSe. Substitution of Ag for Cu in CZTSSe can widen the kesterite band gap to values closer to the ideal band gap of 1.4 eV for solar cell absorbers.

Exemplary applications/uses to which the present invention can be applied include, but are not limited to: photocells and other photovoltaic devices.

Referring now to the drawings in which like numerals represent the same or similar elements and initially to FIG. 1, a block/flow diagram of a preparation and forming method is shown, in accordance with an embodiment of the present invention.

Block 110 shows the dissolving of the chelating agent in an aprotic solvent for preparation of the metal solution, in accordance with an embodiment of the present invention.

In one or more embodiments, the selenourea can be the chelating agent used in dimethyl sulfoxide (DMSO) solvent to produce $Ag_2ZnSn(S, Se)_4$. In various embodiments, tetrahydro furan (THF) or dimethylformamide (DMF), can be used as the aprotic solvent in place of the DMSO to form the solution. The aprotic solvent can be a polar aprotic solvent.

Block 120 shows the dissolving of the metal source in the aprotic solvent with the chelating agent for preparation of the metal solution, in accordance with an embodiment of the present invention.

Metal sources can be metal (e.g., Ag, Zn, Sn) chlorides, iodides, bromides, nitrates, or acetates. In various embodiments, chloride salts of silver (Ag), zinc (Zn), and tin (Sn) are dissolved in DMSO through complexation with selenourea. The metal salts of the silver (Ag), zinc (Zn) and tin (Sn) can be used to dissolve the metal ions in the DMSO to prepare the metal solution. A sulfur source can be added to the solution, where the sulfur source can be elemental sulfur. In various embodiments, the DMSO and/or added thiourea can be the sulfur source. The selenourea can be a selenium source in the solution.

In a non-limiting exemplary embodiment, the metal salts and selenourea can be stirred in DMSO overnight (about 8-12 hours) to form a metal solution having a light golden color.

In various embodiments, the selenourea, $SeC(NH_2)_2$ to metals atomic ratio can be from about 0.25 to about 5. The total metal concentration can be from about 0.1 Molar (M) to about 5 M with ratios that can be selected to give a composition within the following ranges: $Ag_{(2-x)}Zn_{(1+y)}Sn(S_{(1-z)}Se_{(z)})_{(4+q)}$, wherein $0 \leq x \leq 1$; $0 \leq y \leq 1$; $0 \leq z \leq 1$; $-1 \leq q \leq 1$.

In various embodiments, the silver salt, AgX, can have a concentration in the range of about 0.05 M to about 2 M, or in the range of about 0.2 M to about 1 M, or in the range of about 0.4 M to about 6 M.

In various embodiments, the zinc salt, ZnX, can have a concentration in the range of about 0.02 M to about 1.5 M, or in the range of about 0.1 M to about 0.8 M, or in the range of about 0.2 M to about 0.5 M.

In various embodiments, the tin salt, SnX, can have a concentration in the range of about 0.02 M (normal) to about 1.5 M, or in the range of about 0.1 M to about 0.8 M, or in the range of about 0.2 M to about 0.5 M.

In a non-limiting exemplary embodiments, 256 mg of selenourea, 125 mg of silver chloride, 95 mg of tin (II) chloride, and 75 mg of zinc chloride can be dissolved in 1.5 milliliters (ml) of dimethyl sulfoxide (DMSO) at normal temperature (i.e., 20° C.) and standard pressure (i.e., 1 Atm), also referred to as NTP.

In various embodiments, the DMSO can be heated to a temperature in the range of about 20° C. to about 50° C., wherein the heating can increase the rate of dissolution. In various embodiments, the DMSO is not heated to avoid decomposition of the metal complex and precipitation of nanoparticles.

In one or more embodiments, the metal salts can be in the DMSO for a period of at least 1 minute to about 48 hours, or a period of 1 hour to about 24 hours, or in a period of about 8 hours to about 12 hours. The DMSO-metal salt solution can be a light golden color. The metal salts can completely dissolve in the solution to form a concentrated solution. In various embodiments, the metal salt solution is not a saturated solution.

Block 130 shows the coating of the chelated metal solution on a substrate to form a film layer, in accordance with an embodiment of the present invention.

In one or more embodiments, the metal solution can be coated on a substrate, where the metal solution can be applied by a liquid deposition technique, such as but not limited to spin coating, inkjet printing, spray coating, or a combination thereof. The conductive substrate can be a semiconductor substrate or an insulating substrate, such as but not limited to glass coated with molybdenum or a transparent conductive oxide (e.g., indium-tin-oxide (ITO)). In an embodiment, the conductive substrate can be a fluoride-doped tin oxide (FTO) coated glass. The substrate can be transparent to the wavelength of light predetermined to be absorbed by the solar cell(s). The chelated metal solution can form a film on the conductive substrate. Multiple layers can be coated on the conductive substrate to increase the film thickness.

The spin coating can be conducted at a speed in the range of about 1500 RPM to about 2500 RPM, or in the range of about 1750 RPM to about 2250 RPM, or in the range of about 1900 RPM to about 2100 RPM.

In various embodiments, the spin coating can be conducted for a period of about 100 seconds to about 140 seconds.

Block 140 shows the heat treating of a coating on a substrate, in accordance with an embodiment of the present invention.

The coated substrate can be heat treated at a temperature in the range of about 300° C. to about 550° C., or in the range of about 380° C. to about 460° C., or in the range of about 410° C. to about 430° C. The heat treating can drive off solvent and form the $Ag_2ZnSn(S,Se)_4$ layer on the substrate from the previously dissolved precursors.

The heat treatment can be conducted for a duration in the range of about 10 seconds to about 3600 seconds, or in the range of about 30 seconds to about 300 seconds, or in the range of about 60 seconds to about 120 seconds.

Block 150 shows that the coating and the heat treating of the $Ag_2ZnSn(S,Se)_4$ layer(s) can be repeated to form thicker films, in accordance with an embodiment of the present invention.

Blocks 130 and 140 can be repeated to form multiple layers on the substrate, where the $Ag_2ZnSn(S,Se)_4$ layers are formed on top of each other.

Block 160 shows the heat treating of the $Ag_2ZnSn(S,Se)_4$ layer(s) on the substrate in a selenium atmosphere, in accordance with an embodiment of the present invention.

The one or more layer(s) of the $Ag_2ZnSn(S,Se)_4$ compound can be heat treated at a temperature in the range of about 300° C. to about 550° C., or in the range of about 380° C. to about 460° C., or in the range of about 410° C. to about 430° C. The heat treatment can be conducted in an environment including selenium vapor to crystallize the $Ag_2ZnSn(S,Se)_4$ grains. The selenium vapor can have a concentration in the range of about 0.1 mg/l to about 100 mg/l, or in the range of about 1 mg/l to about 50 mg/l. The selenium vapor can be at the saturation point at the annealing temperature. The partial pressure of selenium may be maintained constant throughout the duration of the heat treatment.

In various embodiments, elemental sulfur can be vaporized and added to the layer(s) of $Ag_2ZnSn(S,Se)_4$ compound. The vaporized sulfur can be included in the heat treatment in the environment with the selenium vapor to control the ratio of sulfur to selenium. In various embodiments, the heat treatment can be conducted in an environment including sulfur vapor before the heat treatment in the environment including selenium vapor or after the heat treatment in the environment including selenium vapor. The $Ag_2ZnSn(S,Se)_4$ compound can be exposed to the sulfur and selenium simultaneously or sequentially. The sulfur partial pressure, and thereby the ratio of sulfur to selenium, can be adjusted to modify the band gap of the $Ag_2ZnSn(S,Se)_4$ compound.

Figure 2:
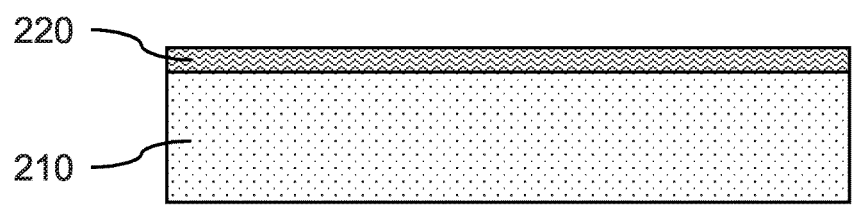
FIG. 2 is a cross-sectional view of a $Ag_2ZnSn(S,Se)_4$ compound on a substrate, in accordance with an embodiment of the present invention.

FIG. 2 is a cross-sectional view of a $Ag_2ZnSn(S,Se)_4$ compound on a substrate, in accordance with an embodiment of the present invention.

In one or more embodiments, multiple layers of the $Ag_2ZnSn(S,Se)_4$ compound can be formed on the substrate 110 to form a $Ag_2ZnSn(S,Se)_4$ compound coating with a predetermined thickness. The $Ag_2ZnSn(S,Se)_4$ compound layers can be formed one on top of the next by repeating the coating and heat treating processes.

Each of the layers can have a thickness in the range of about 10 nm to about 500 nm, or about 20 nm to about 100 nm, and the multiple layers can achieve a total layer thickness of about 10 nm to about 2000 nm, or about 50 nm to about 2000 nm, or about 200 nm to about 2000 nm, although other thicknesses are contemplated.

The $Ag_2ZnSn(S,Se)_4$ crystals of the coating have a crystal size in the range of about 0.8 um (microns) to about 1.2 um.

The band gap of the obtained $Ag_2ZnSn(S,Se)_4$ material extracted by extrapolation of the Tauc plot can coincide with the zero position of the center of a photoluminescence peak. The center of the photoluminescence peak can be at a photon energy of about 1.34 eV. The PL measurements are obtained using a Hamamatsu single photon counting system utilizing a 532 nm solid state laser with a pulse width less than 1 ns and repetition rate of 15 kHz.

The flowchart and block diagrams in the Figures illustrate a process for silver-containing chalcogenide layer deposition according to various embodiments of the present invention. In this regard, each block in the flowchart or block diagrams may represent an approach to forming a silver-containing chalcogenide layer on a surface. For example, two blocks shown in succession may, in fact, be executed substantially concurrently, or the blocks may sometimes be executed in the reverse order, depending upon the process involved.

It is to be understood that the present invention will be described in terms of a given illustrative architecture having substrates and photovoltaic stacks; however, other architectures, structures, substrates, materials and process features and steps may be varied within the scope of the present invention.

Figure 3:
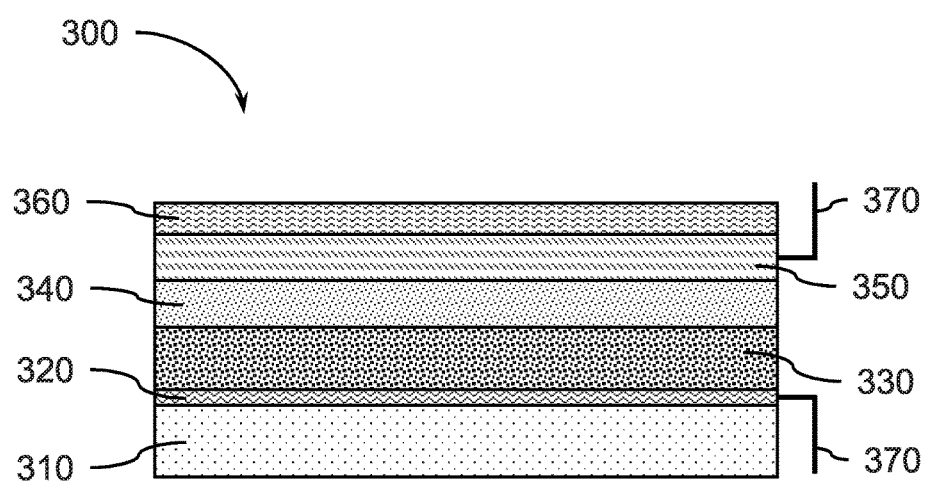
FIG. 3 is a diagram of a solar cell device, in accordance with an embodiment of the present invention.

FIG. 3 is a diagram of a solar cell device, in accordance with an embodiment of the present invention.

In one or more embodiments, a layer of $Ag_2ZnSn(S,Se)_4$ 330 can be formed on a conductive base layer 320 on a substrate 310. The substrate 310 can be a glass, plastic, ceramic, or semiconductor. The conductive base layer 320 can be fluoride-doped tin oxide (FTO) or indium-tin-oxide (ITO). The $Ag_2ZnSn(S,Se)_4$ layer 330 can be formed by the process described herein. A semiconductor film 340 (e.g., cadmium sulfide (CdS)) with a polarity opposite from the $Ag_2ZnSn(S,Se)_4$ layer 330 (e.g., n-type compared to p-type) can be in physical and electrical contact with the $Ag_2ZnSn(S,Se)_4$ layer 330. A transparent conductive cover layer 350 can be on the semiconductor film 340, where the transparent conductive cover layer 350 can be aluminum doped zinc oxide (AZO). A contact layer 360 can be on the transparent conductive cover layer 350, where the contact layer 360 can provide optical properties to the exposed face (e.g., window-side) of the solar cell device 300. Electrical connections 370 can be formed to the conductive base layer 320 and transparent conductive cover layer 350 of the solar cell device 300.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention will be described in terms of a particular tandem (multi-junction) structure; however, other architectures, structures, substrate materials and process features and steps may be varied within the scope of the present invention. The tandem structure includes cells, which will be described in terms of a particular material. Each cell includes a p-doped layer, an n-doped layer and perhaps an undoped intrinsic layer. For the present description, the n-doped layer and p-doped layers will be formed either from a same base material that is doped to provide an n-type portion and a p-type portion or from two different base materials so that a first material is doped to provide the n-type portion and the second material is doped to provide the p-type portion. For simplicity, each cell layer may be described in terms of the base layer material. The n-doped and p-doped regions are preferably formed by doping during epitaxial growth. Other doping methods may also be employed. While intrinsic layers may be formed between the n-type and p-type layers, e.g., very thin intrinsic layers inserted intentionally between an emitter and a base to mitigate intermixing of the dopants at a junction, the intrinsic layers, if needed, are not depicted in the drawings for simplicity.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_xGa_{1-x}As$, where x is less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a method for silver-containing chalcogenide layer deposition (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A solar cell, comprising:
an $Ag_2ZnSn(S,Se)_4$ compound layer on a substrate.

2. The solar cell of claim 1, wherein the $Ag_2ZnSn(S,Se)_4$ compound layer includes $Ag_2ZnSn(S,Se)_4$ crystal grains.

3. The solar cell of claim 2, wherein the $Ag_2ZnSn(S,Se)_4$ crystal grains have a crystal size in the range of about 0.8 um (microns) to about 1.2 um.

4. The solar cell of claim 1, further comprising a conductive base layer on the substrate, wherein the conductive base layer is between the $Ag_2ZnSn(S,Se)_4$ compound layer and the substrate.

5. The solar cell of claim 4, further comprising a semiconductor film on the $Ag_2ZnSn(S,Se)_4$ compound layer.

6. The solar cell of claim 5, wherein the semiconductor film is cadmium sulfide.

7. The solar cell of claim 5, further comprising a transparent conductive cover layer on the semiconductor film.

8. The solar cell of claim 7, wherein the transparent conductive cover layer is aluminum doped zinc oxide.

9. The solar cell of claim 8, further comprising electrical connections to the conductive base layer and transparent conductive cover layer.

10. A solar cell, comprising:
a conductive base layer on the substrate;
an $Ag_2ZnSn(S,Se)_4$ compound layer on the conductive base layer, wherein the $Ag_2ZnSn(S,Se)_4$ compound layer includes $Ag_2ZnSn(S,Se)_4$ crystal grains;
a semiconductor film on the $Ag_2ZnSn(S,Se)_4$ compound layer;
a transparent conductive cover layer on the semiconductor film; and electrical connections to the conductive base layer and transparent conductive cover layer.

11. The solar cell of claim 10, wherein the $Ag_2ZnSn(S,Se)_4$ compound layer has a photoluminescence peak at a photon energy of about 1.34 eV.

12. The solar cell of claim 10, wherein the $Ag_2ZnSn(S,Se)_4$ compound layer has a thickness in the range of about 10 nm to about 2000 nm.

13. The solar cell of claim 10, wherein the $Ag_2ZnSn(S,Se)_4$ compound layer includes $Ag_2ZnSn(S,Se)_4$ crystal grains with a crystal size in the range of about 0.8 um (microns) to about 1.2 um.

14. The solar cell of claim 13, wherein the conductive base layer is selected from the group consisting of fluoride-doped tin oxide (FTO) and indium-tin-oxide (ITO).

15. The solar cell of claim 14, wherein the semiconductor film is cadmium sulfide.

16. A method of preparing a solar cell having a $Ag_2ZnSn(S,Se)_4$ compound layer, comprising:

dissolving selenourea ($SeC(NH_2)_2$), silver chloride (AgCl), zinc chloride ($ZnCl_2$), and tin (IV) chloride ($SnCl_4$) in dimethyl sulfoxide (DMSO) to form a metal solution; and coating the metal solution on a conductive base layer on a substrate by spin coating, inkjet printing, or spray coating to form an $Ag_2ZnSn(S,Se)_4$ compound coating.

17. The method of claim 16, wherein the conductive substrate is glass coated with molybdenum.

18. The method of claim 16, wherein the $Ag_2ZnSn(S,Se)_4$ compound coating on the substrate has a thickness in the range of about 10 nm to about 2000 nm.

19. The method of claim 16, wherein $Ag_2ZnSn(S,Se)_4$ crystals of the coating have a crystal size in the range of about 0.8 um (microns) to about 1.2 um.

20. The method of claim 19, wherein the center of the photoluminescence peak is at a photon energy of about 1.34 eV.

* * * * *